United States Patent
Lin et al.

(10) Patent No.: US 8,212,987 B2
(45) Date of Patent: Jul. 3, 2012

(54) LIQUID CRYSTAL DISPLAY DEVICE AND THE MANUFACTURING METHOD THEREOF

(75) Inventors: Hantu Lin, Hsinchu (TW); Chih-Chun Yang, Hsinchu (TW); Chiajung Yang, Hsinchu (TW); Chienhung Chen, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 1063 days.

(21) Appl. No.: 12/133,640

(22) Filed: Jun. 5, 2008

(65) Prior Publication Data

US 2009/0051839 A1 Feb. 26, 2009

(30) Foreign Application Priority Data

Aug. 20, 2007 (TW) .............................. 96130751 A

(51) Int. Cl.
*G02F 1/13* (2006.01)
(52) U.S. Cl. .............. 349/187; 349/38; 349/43
(58) Field of Classification Search ............ 349/187
See application file for complete search history.

(56) References Cited

U.S. PATENT DOCUMENTS

| | | | |
|---|---|---|---|
| 6,528,357 B2 * | 3/2003 | Dojo et al. | 438/151 |
| 6,787,052 B1 | 9/2004 | Vaganov | |
| 6,894,735 B2 | 5/2005 | Chae et al. | |
| 6,897,099 B2 | 5/2005 | Yoo et al. | |
| 7,351,623 B2 | 4/2008 | Ahn | |
| 7,435,632 B2 | 10/2008 | Lee et al. | |
| 7,522,224 B2 * | 4/2009 | Hwang et al. | 349/38 |
| 2004/0125327 A1 | 7/2004 | Choi et al. | |
| 2005/0122458 A1 | 6/2005 | Yang | |
| 2005/0151195 A1 | 7/2005 | Kawase et al. | |
| 2005/0190312 A1 | 9/2005 | Yang | |
| 2010/0308336 A1 | 12/2010 | Lee et al. | |

FOREIGN PATENT DOCUMENTS

| | | |
|---|---|---|
| CN | 1702530 | 11/2005 |
| TW | 200725900 | 7/2007 |
| TW | 200725913 | 7/2007 |

OTHER PUBLICATIONS

Chinese language office action dated Sep. 19, 2008.
Taiwan search report mailed Mar. 1, 2011.

* cited by examiner

*Primary Examiner* — Richard Kim
(74) *Attorney, Agent, or Firm* — Thomas, Kayden, Horstemeyer & Risley, LLP

(57) ABSTRACT

A liquid crystal display device having an improved aperture ratio and the manufacturing method thereof are provided. The liquid crystal display device has a storage capacitor with two patterned transparent conductive layers serving as two electrodes. Therefore the storage capacitor is pervious to light and the transparent area of the display device is enlarged so as to improve the aperture ratio.

18 Claims, 9 Drawing Sheets

LIQUID CRYSTAL DISPLAY DEVICE AND THE MANUFACTURING METHOD THEREOF

This application claims the benefit from the priority of Taiwan Patent Application No. 096130751 filed on Aug. 20, 2007, the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to a liquid crystal display (LCD) device. More particularly, the present invention relates to an LCD device that has an improved aperture ratio.

2. Descriptions of the Related Art

A conventional thin film transistor (TFT) LCD device is comprised of a top substrate and a bottom substrate, with various elements such as transistors, storage capacitors, pixel electrodes, scanning lines, data lines and the like being interposed therebetween. In the designing process of an LCD device, a transistor structure is typically determined first in accordance with the TFT manufacturing process, followed by determination of a storage capacitor structure. A storage capacitor comprises two electrodes, at least one of which is generally an opaque electrode. Consequently, the storage capacitor may lead to a reduced aperture ratio of the LCD device. As is well known, the aperture ratio is generally defined as a ratio of a light transmissive area of conductive electrodes to a total device area in a single LCD device. The higher the aperture ratio, the more light the LCD device may transmit, and therefore the better the display effect will be.

As the storage capacitors occupy a certain percentage of the total area in an LCD device, the opaque electrodes thereof may significantly reduce the aperture ratio of the LCD device. In view of this, it is highly desirable in the art to provide a storage capacitor structure that can improve the aperture ratio in an LCD device.

SUMMARY OF THE INVENTION

The primary objective of this invention is to provide an LCD device and a manufacturing method thereof. The LCD device comprises a storage capacitor with two patterned transparent conductive layers serving as two electrodes thereof. Therefore, the storage capacitor is designed to allow light transmissive, thus enlarging the transparent area of the LCD device and improving the aperture ratio.

To this end, the manufacturing steps of the storage capacitor of this invention can be integrated into manufacturing methods of various LCD devices. For example, a step of forming a patterned second transparent conductive layer of the storage capacitor may be incorporated into an LCD device manufacturing method involving three masks, with the patterned second transparent conductive layer also functioning as a passivation layer of the LCD device. Alternatively, the step of forming the patterned second transparent conductive layer may also be incorporated into an LCD device manufacturing method involving four, five or six masks. In this way, the storage capacitor can be provided with two patterned transparent conductive layers as two electrodes thereof, with the patterned second transparent conductive layer also functioning as an electrical connection with transistors, pixels and storage capacitors in the LCD device.

To this end, the manufacturing steps of the storage capacitor of this invention can be integrated into a method of manufacturing an LCD device with a half-tone mask, so as to reduce the number of manufacturing steps of the LCD device and the cost of masks by use of the half-tone mask process.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The following description of this invention relates to an LCD device and a manufacturing method thereof. However, embodiments of this invention are not limited to any specific environment, application or implementation, and therefore, the description of the embodiments herein is only intended to illustrate this invention, but not to limit the scope thereof.

Figure 1A:
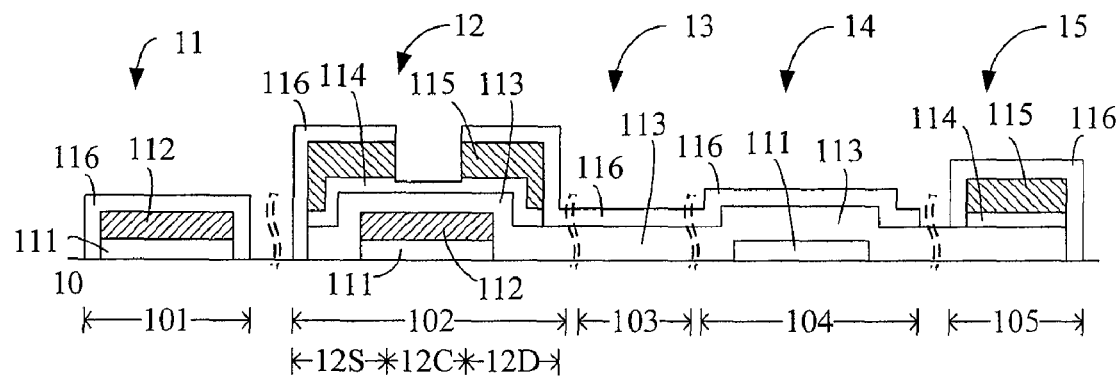
FIG. 1*a* is a schematic cross-sectional view of an embodiment of an LCD device in accordance with this invention.

FIG. 1*a* illustrates a schematic cross-sectional view of an embodiment of an LCD device in accordance with this invention. The LCD device comprises a substrate 10, a scan-pad 1, a transistor 12, a pixel electrode 13, a storage capacitor 14, and a data-pad 15, which are all depicted in a single cross-sectional view and separated by division lines for purpose of description. The substrate 10 comprises a scan line region 101, a transistor region 102, a pixel region 103, a storage capacitor region 104, and a data line region 105. The transistor 12 is formed in the transistor region 102, and comprises a patterned first transparent conductive layer 111, a patterned first conductive layer 112, a dielectric layer 113, a patterned semiconductor layer 114, a patterned second conductive layer 115, and a patterned second transparent conductive layer 116 stacked in series. The patterned first transparent conductive layer 111 and the patterned first conductive layer 112 form a gate of the transistor 12. The patterned second transparent conductive layer 116 defines a channel region 12C in the patterned semiconductor layer, and also defines a source region 12S and a drain region 12D of the transistor 12 adjacent to two sides of the channel region 12C.

The pixel electrode 13, which is formed in the pixel region 103 on the substrate 10, comprises the patterned second transparent conductive layer 116 and is electrically connected to the drain region 12D. It can be seen from the figure that the patterned second transparent conductive layer 116 in the drain region 12D is electrically connected to patterned second transparent conductive layer 116 in the pixel electrode 13, so the pixel electrode 13 may be electrically connected to the drain region 12D through the patterned second transparent conductive layer 116.

The storage capacitor 14 is formed in the storage capacitor region 104 of the substrate 10, and comprises the patterned first transparent conductive layer 111, the dielectric layer 113, and the patterned second transparent conductive layer 116 stacked in series. The patterned second transparent conductive layer 116 of the storage capacitor 14 is electrically connected with the pixel electrode 13, and thus electrically connected with the drain region 12D of the transistor 12. The storage capacitor 14 is now light transmissive by utilizing the patterned first transparent conductive layer 111 and the patterned second transparent conductive layer 116 respectively as the two electrodes thereof, and thus improving the aperture ratio of the LCD device.

The scan-pad 11 is formed in the scan-pad region 101 of the substrate 10, and composed of the patterned first transparent conductive layer 111, the patterned first conductive layer 112, and the patterned second transparent conductive layer 116 stacked in series. The data-pad 15 is formed in the data-pad region 105 of the substrate 10, and composed of the dielectric layer 113, the patterned semiconductor layer 114, the patterned second conductive layer 115, and the patterned second transparent conductive layer 116 stacked in series.

In this embodiment, in addition to its conductive function, the patterned second transparent conductive layer 116 of the LCD device also functions to protect the electrodes and avoid erosion of other conductive layers.

Figure 1B:
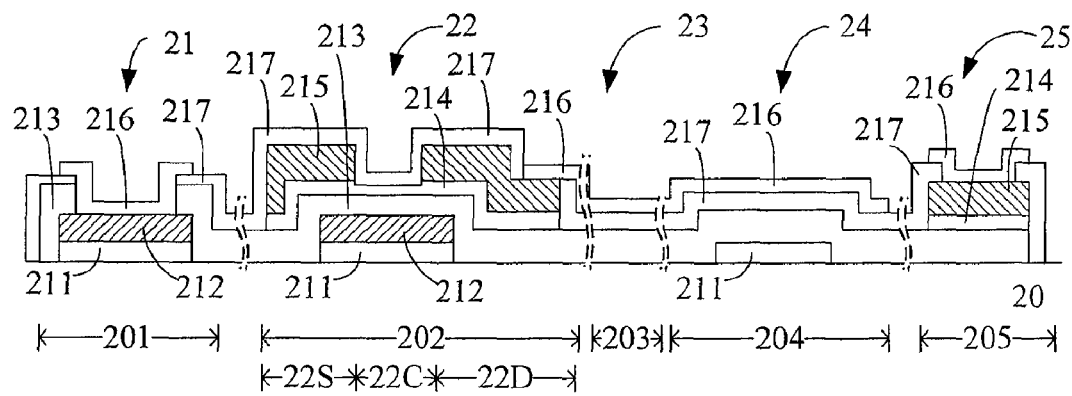
FIG. 1*b* is a schematic cross-sectional view of another embodiment of the LCD device in accordance with this invention.

FIG. 1b illustrates a schematic cross-sectional view of another embodiment of the LCD device in accordance with this invention. The most prominent difference from this embodiment to the embodiment shown in FIG. 1a is that, this LCD device shown in FIG. 1b further comprises a passivation layer 217. In this embodiment, the LCD device comprises a substrate 20, a scan-pad 21, a transistor 22, a pixel electrode 23, a storage capacitor 24, and a data-pad 25, which are all depicted in a single cross-sectional view and separated by division lines for purpose of description. The substrate 20 comprises a scan line region 201, a transistor region 202, a pixel region 203, a storage capacitor region 204, and a data line region 205. The transistor 22 is formed in the transistor region 202, and composed of a patterned first transparent conductive layer 211, a patterned first conductive layer 212, a dielectric layer 213, a patterned semiconductor layer 214, a patterned second conductive layer 215, a passivation layer 217 and a patterned second transparent conductive layer 216 stacked in series. The patterned first transparent conductive layer 211 and the patterned first conductive layer 212 form a gate of the transistor 22. The patterned second conductive layer 215 defines a channel region 22C in the patterned semiconductor layer 214, and also defines a source region 22S and a drain region 22D of the transistor 22 adjacent to two sides of the channel region 22C. The patterned second transparent conductive layer 216 is electrically connected with the drain region 22D.

Since a passivation layer 217 is formed in the LCD, the patterned second transparent conductive layer 216 in this embodiment is adapted to mainly provide a conductive function. Therefore, other regions are also formed with both the patterned second transparent conductive layer 216 and the passivation layer 217.

The pixel electrode 23, which is formed in the pixel region 203 on the substrate 20, composed of the patterned second transparent conductive layer 216 and is electrically connected to the drain region 22D of the transistor 22. It can be seen from the figure that the drain region 22D is not entirely covered by the passivation layer 217, and the patterned second transparent conductive layer 216 in the drain region 22D is electrically connected to patterned second transparent conductive layer 216 in the pixel electrode 23, so the pixel electrode 23 may be electrically connected to the drain region 22D through the patterned second transparent conductive layer 216.

The storage capacitor 24 is formed in the storage capacitor region 204 of the substrate 20, and composed of the patterned first transparent conductive layer 211, the dielectric layer 213, the passivation layer 217 and the patterned second transparent conductive layer 216 stacked in series. The storage capacitor 24 is electrically connected with the pixel electrode 23 through the patterned second transparent conductive layer 216, and also electrically connected with the drain region 22D of the transistor 22. The storage capacitor 24 becomes light transmissive by utilizing the patterned first transparent conductive layer 211 and the patterned second transparent conductive layer 216 respectively as the two electrodes thereof, and thus improving the aperture ratio of the LCD device. It should be noted that, the storage capacitor 24 of this embodiment differs from the storage capacitor 14 of the embodiment shown in FIG. 1a in that, a passivation layer 217 is further sandwiched between the patterned first transparent conductive layer 211 and the patterned second transparent conductive layer 216 in addition to the dielectric layer 213.

The scan-pad 21 is formed in the scan-pad region 201 of the substrate 20, and composed of the patterned first transparent conductive layer 211, the patterned first conductive layer 222, the passivation layer 217 and the patterned second transparent conductive layer 216 stacked in series. The data-pad 25 is formed in the data-pad region 205 of the substrate 20, and composed of the dielectric layer 213, the patterned semiconductor layer 214, the patterned second conductive layer 215, and the patterned second transparent conductive layer 216 stacked in series.

Figure 2A:
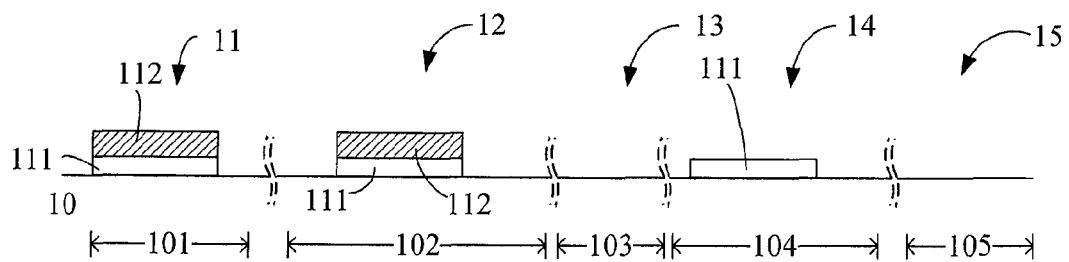
FIG. 2*a*-2*c* illustrates a schematic flow diagram of a process of manufacturing an LCD device in accordance with this invention.
Figure 2B:
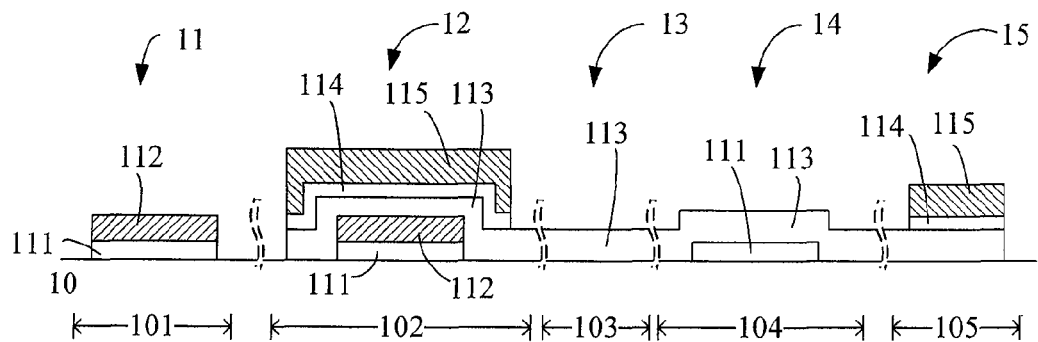
Figure 2C:
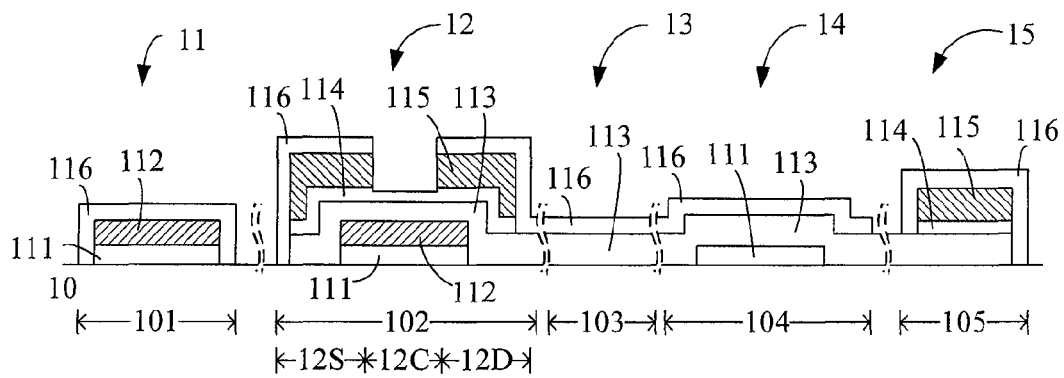

FIGS. 2a-2c illustrate schematic cross-sectional views of a method for manufacturing an LCD device in accordance with this invention. This method utilizes three half-tone masks to manufacture an LCD device, for example, the LCD device shown in FIG. 1a. FIG. 2a illustrates the result of performing a step of forming a conductive structure. This step can result in a conductive structure of the scan-pad 11, a gate of the transistor region 102 and a first electrode of the storage capacitor region 104. Here, the conductive structure of the scan-pad 11 is composed of the patterned first transparent conductive layer 111 and the patterned first conductive layer 112, the gate is composed of the patterned first transparent conductive layer 111 and the patterned first conductive layer 112 stacked in series, and the first electrode is composed of the patterned first transparent conductive layer 111.

Figure 3A:
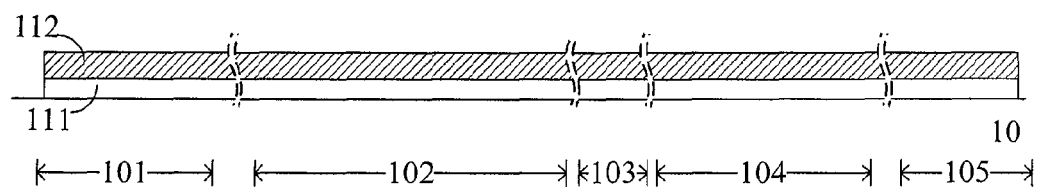
FIG. 3*a*-3*d* illustrates a schematic view of a half-tone mask manufacturing process.
Figure 3B:
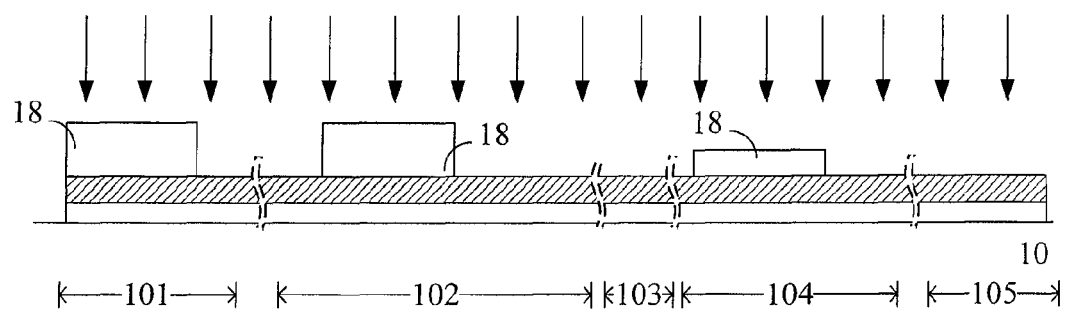
Figure 3C:
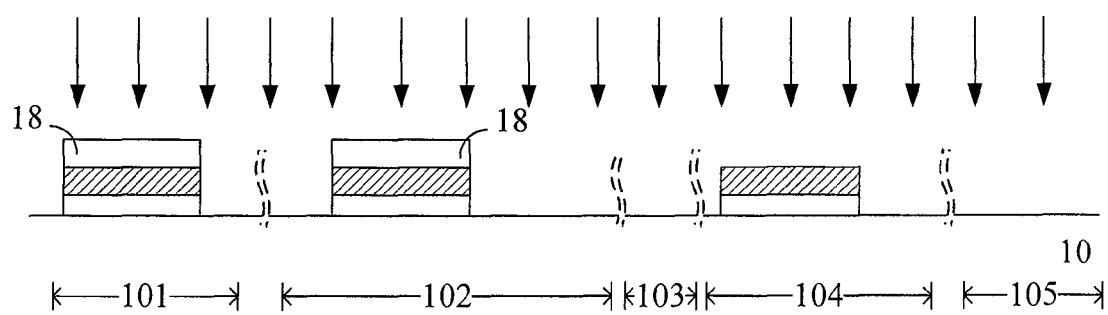
Figure 3D:
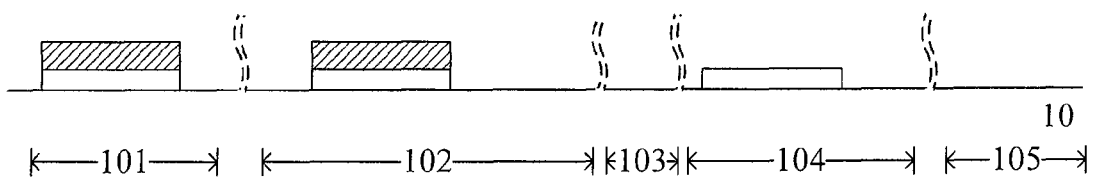

More specifically, the conductive structure illustrated in FIG. 2a is formed by applying a half-tone mask (HTM) in a single mask process which comprises the following steps. Referring to FIGS. 3a-3d together, this process begins with a step of forming a first transparent conductive layer on the substrate 10, followed by a step of forming a first conductive layer to cover the first transparent conductive layer, as shown in FIG. 3a. Subsequently, photo-resistors 18 with different vertical dimensions are formed in the scan-pad region 101, the transistor region 102 and the storage capacitor region 104 respectively by the HTM to define etching regions, as shown in FIG. 3b. Here, the photo-resistors 18 in the scan-pad region 101 and the transistor region 102 have greater vertical dimensions than that in the storage capacitor region 104. Then, regions of the first conductive layer and the first transparent conductive layer that are not covered by the photo-resistors 18 are etched to expose regions of the substrate 10 that are not covered by the photo-resistors 18. After the etching step, the photo-resistors are ashed until the patterned first conductive layer is exposed in the storage capacitor region 104, thus obtaining a structure as shown in FIG. 3c. Here, as the photo-resistors 18 in the scan-pad region 101 and the transistor region 102 have greater vertical dimensions, some unashed photo-resistors 18 still remain thereon. Afterwards, the patterned first conductive layer in the storage capacitor region 104 is further etched to form the patterned first conductive layer 112 and expose the patterned first transparent conductive layer 111 thereunder. Finally, residual photo-resistors are removed to obtain a structure as depicted in FIG. 3d.

FIG. 2b illustrates the result of performing a step of forming a semiconductor structure. This step can result in a semiconductor region of the transistor region 102, a dielectric region of the pixel region 103, and a dielectric region of the storage capacitor region 104. The semiconductor structure in the transistor region 12 is composed of a dielectric layer 113, a patterned semiconductor layer 114, and a patterned second conductive layer 115 stacked in series, the semiconductor structure in the pixel region 103 and the storage capacitor region 104 is composed of the dielectric layer 113.

More specifically, the semiconductor structure illustrated in FIG. 2b is formed by applying an HTM in a single mask process comprising the following steps. Similarly to what is shown in FIGS. 3a-3d, the HTM is used to form photo-resistors with different vertical dimensions in various regions to facilitate multiple etching operations. This process begins with a step of forming a dielectric layer, a semiconductor layer, and a second conductive layer on the LCD device region sequentially. Then the HTM is utilized to form photo-resistors with different vertical dimensions in the transistor region 12, the pixel region 13 and the storage capacitor region 14 respectively to define etching regions. Subsequently, regions of the dielectric layer, the semiconductor layer, and the second conductive layer that are not covered by the photo-resistors are etched. Following the etching step, the dielectric layer, the semiconductor layer, and the second conductive layer in the scan-pad region 101 are removed. Thereafter, the photo-resistors are ashed until the patterned second conductive layer in the pixel region 103 and the storage capacitor region 104 are exposed. Afterwards, the patterned second conductive layer in the pixel region 103 and the storage capacitor region 104, as well as the patterned semiconductor layer 114 thereunder are etched. Finally, the residual photo-resistors are removed to complete the structure shown in FIG. 2b.

Figure 7A:
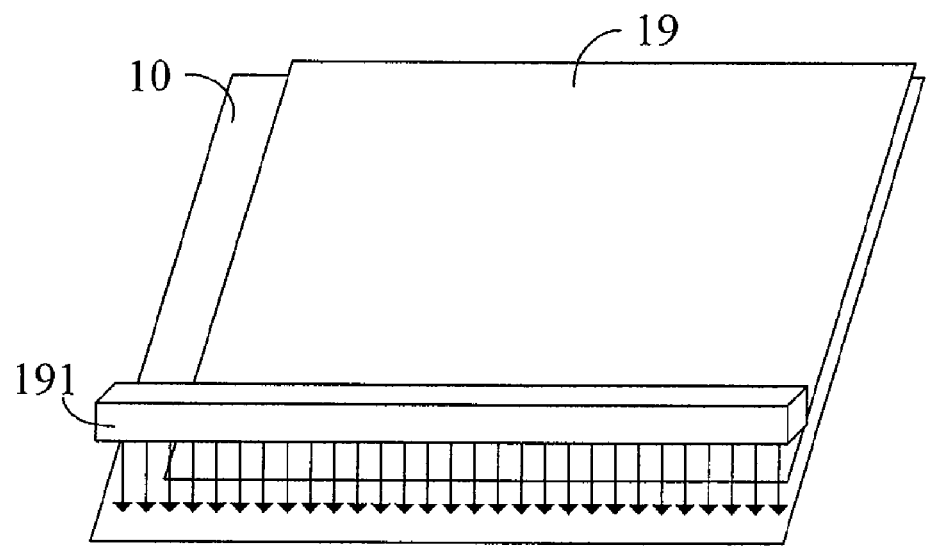
FIG. 7*a*-7*b* illustrates a schematic view of an AP plasma process.
Figure 7B:
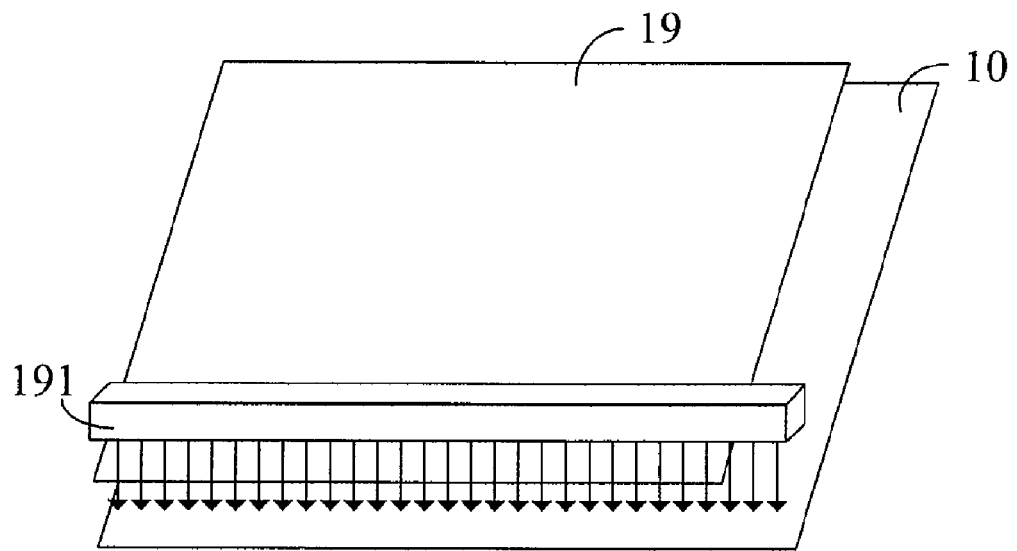

In an alternative embodiment, another method of forming the structure depicted in FIG. 2b may employ an AP plasma process to obtain the dielectric layer 113 and the patterned semiconductor layer 114, which comprises the following steps. At first, the second conductive layer 115 is patterned with a normal patterning mask through lithographic and etching steps. Then using the patterned second conductive layer 115 as a hard mask, regions of the patterned semiconductor layer 114 not covered by the patterned second conductive layer 115 are etched by the AP plasma process. Here, etching of the patterned semiconductor layer 114 is accomplished by scanning the substrate 10 with an AP plasma. Subsequently, a shielding mask, such as a metal shielding mask 19, is posited over the substrate 10, and then the dielectric layer 113 in the LCD region is covered by the metal shielding mask 19 and the regions of the dielectric layer 113 not covered by the metal shielding mask 19 are etched by the AP plasma process. Referring to FIG. 7a and FIG. 7b together, regions of the dielectric layer 113 on the scan-pad region 101 which are not covered by the metal shielding mask 19 are etched sequentially by an AP plasma while the substrate 10 is being rotated. Specifically, as shown in FIG. 7a, with the AP plasma emitter 191 being fixed, a region of the dielectric layer 113 not covered by the metal shielding mask 19 is first etched, after which the substrate 10 is rotated as shown in FIG. 7b to continue the etching operation on another region of the dielectric layer 113 not covered by the metal shielding mask 19. Upon completion of the etching step, the metal shielding mask is removed to complete the structure shown in FIG. 2b.

FIG. 2c illustrates the result of performing a step of forming the patterned second transparent conductive layer 116. The patterned second transparent conductive layer 116 obtained in this step forms the pixel electrode 13 of the pixel region 103 and a second electrode of the storage capacitor 14. Further, the patterned second transparent conductive layer 116 covers the scan-pad region 101 and the data-pad region 105, and defines a channel region 12C, a source region 12S and a drain region 12D in the transistor region 102.

More specifically, the structure illustrated in FIG. 2c is formed in a single mask process which comprises the following steps. Initially, a second transparent conductive layer is formed to cover the LCD device region, followed by formation of a photo-resistor in the transistor region 102 to define the channel region 12C. Then, the second transparent conductive layer and the patterned second conductive layer 115 in the channel region 12C are etched to expose the patterned semiconductor layer 114 in the channel region 12C. At this point, except the channel region 12C, the patterned second transparent conductive layer 116 covers the scan-pad region 101, the transistor region 102, the pixel region 103, the storage capacitor regions 104 and the data-pad region 105, thus completing the structure depicted in FIG. 2c.

In FIG. 2c, etching of the patterned semiconductor layer 114 may also be accomplished by an AP plasma process. Since the structure depicted in FIG. 2c is formed with the patterned second transparent conductive layer 116, the patterned second transparent conductive layer 116 may be employed as a hard mask to etch regions of the patterned semiconductor layer 114 in the transistor region 102 which are not covered by the patterned second transparent conductive layer 116 by the AP plasma process. Here, the patterned semiconductor layer 114 is etched by scanning the substrate 10 with an AP plasma.

Figure 4A:
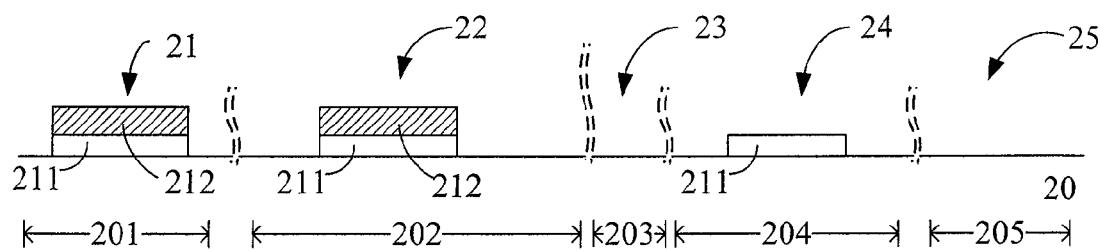
FIG. 4*a*-*d* illustrates a schematic flow diagram of another process of manufacturing an LCD device in accordance with this invention.

FIGS. 4a-4d illustrate a process of another method for manufacturing an LCD device in accordance with this invention. This method utilizes two half-tone masks to manufacture an LCD device, for example, the LCD device shown in FIG. 1b. FIG. 4a illustrates the result of performing a step of forming a conductive structure. This step can result in a conductive structure of the scan-pad 21, a gate of the transistor region 202 and a first electrode of the storage capacitor region 204. Here, the conductive structure of the scan-pad 21 comprises the patterned first transparent conductive layer 211 and the patterned first conductive layer 212, the gate comprises the patterned first transparent conductive layer 211 and the patterned first conductive layer 212 stacked in series, and the first electrode is composed of the patterned first transparent conductive layer 211. More specifically, the conductive structure illustrated in FIG. 4a is formed by applying a half-tone mask (HTM) in a single mask process, which is just the same as what is depicted above in FIG. 3a-3d and therefore will not be described in detail again.

Figure 4B:
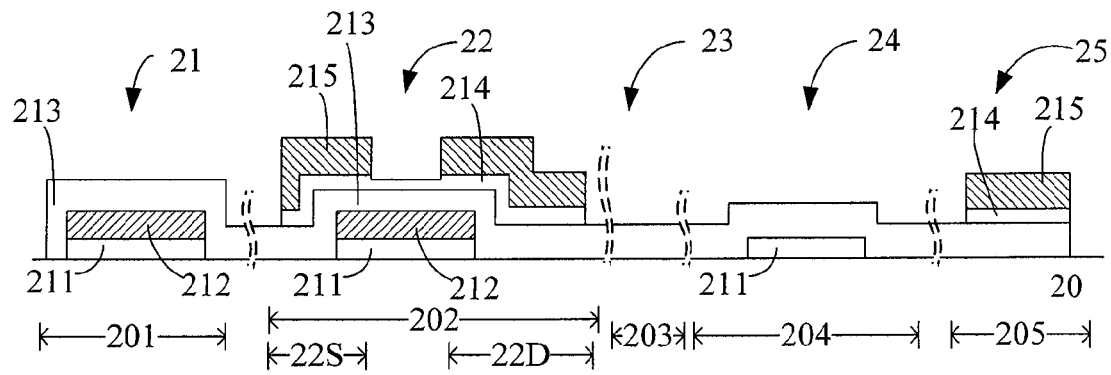

FIG. 4b illustrates the result of performing a step of forming a semiconductor structure in a semiconductor region of the transistor region 202, a dielectric region of the pixel region 203, and a dielectric region of the storage capacitor region 204. The semiconductor structure in the transistor region 22 is composed of a dielectric layer 213, a patterned semiconductor layer 214, and a patterned second conductive layer 215 stacked in series, and is composed of the dielectric layer 213 in the dielectric regions of the pixel region 203 and the storage capacitor region 204. More specifically, the semiconductor structure illustrated in FIG. 4b is formed by applying an HTM in a single mask process. Similarly to what is shown in FIGS. 3a-3d, the HTM is used to form photo-resistors with different vertical dimensions in various regions to facilitate multiple etching operations. It should be noted that, subsequent to the single mask process, the resulting structure differs from the structure shown in FIG. 2b in that, the scan-pad region 201 is covered by the dielectric layer 213, and a source region 22S and a drain region 22D are defined in the transistor region 202 by etching the patterned second conductive layer 215.

As previously described, etching of the patterned semiconductor layer 214 may be accomplished by an AP plasma process. Here, a patterned HTM is also used as a mask to etch the patterned semiconductor layer 214 by scanning the substrate 20 with an AP plasma. Then, the photo-resistors are ashed, and the patterned second patterned conductive layer 215 is etched to form a channel region. Thereafter, the channel region is etched by scanning with an AP plasma process, thereby to complete the patterned semiconductor layer 214.

Figure 4C:
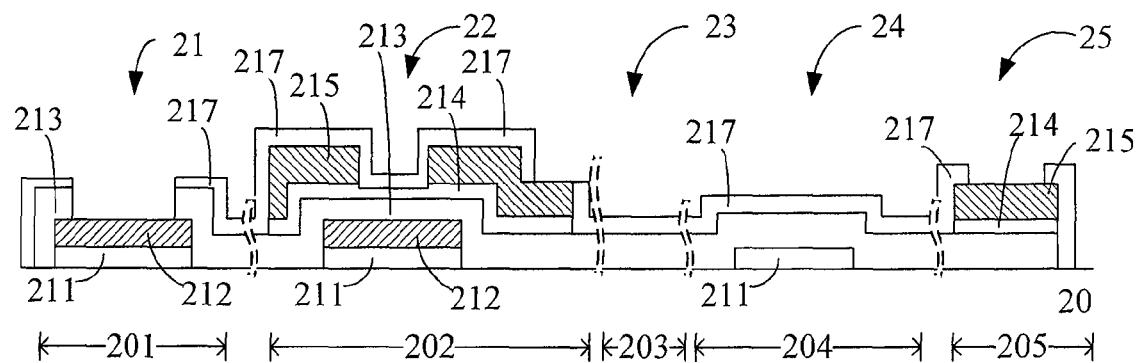

FIG. 4c illustrates the result of performing a step of forming a passivation structure. Upon its formation in various regions, the passivation layer 217 is etched to expose the patterned first conductive layer 212 in the scan-pad region 201, the patterned second conductive layer 215 in the drain region 22D of the transistor region 202, and the patterned second conductive layer 215 in the data-pad region 205.

As previously described, etching of the passivation layer 217 may also be accomplished by an AP plasma process. Here, a metal shielding mask is also posited over the substrate 20, followed by etching of regions of the dielectric layer 213 not covered by the metal shielding mask through the AP plasma process, and then the metal shielding mask is removed. The specific operations will not be described in detail herein again.

Figure 4D:
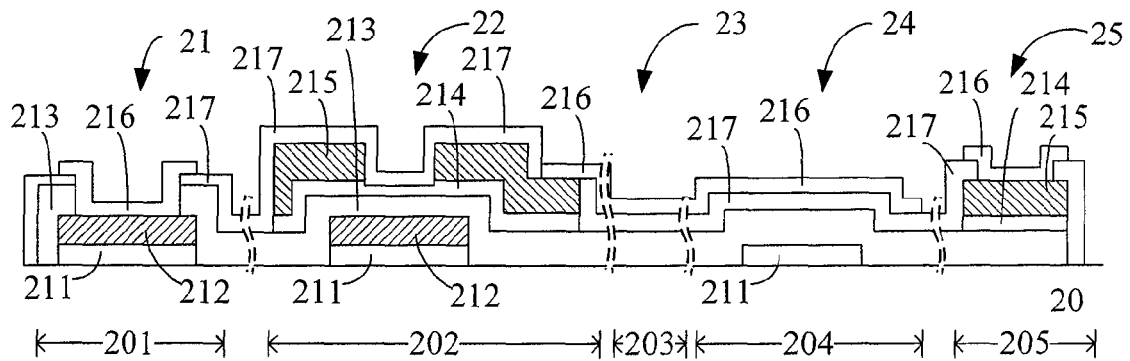

FIG. 4d illustrates the result of performing a step of forming a patterned second transparent conductive layer. This structure is identical to that shown in FIG. 1b, and the forming step thereof is similar to that described in the previous embodiment and therefore will not be described in detail herein.

Figure 5A:
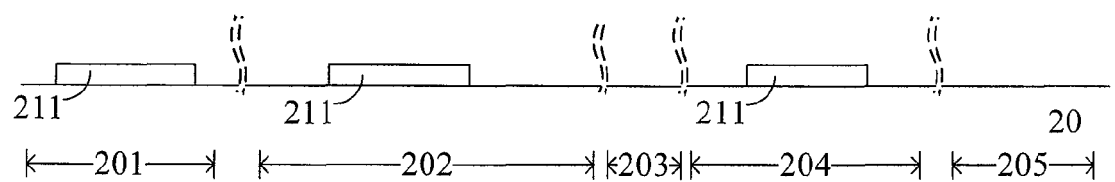
FIG. 5*a*-*b* illustrates a schematic flow diagram of a process of forming a conductive structure with two masks.
Figure 5B:
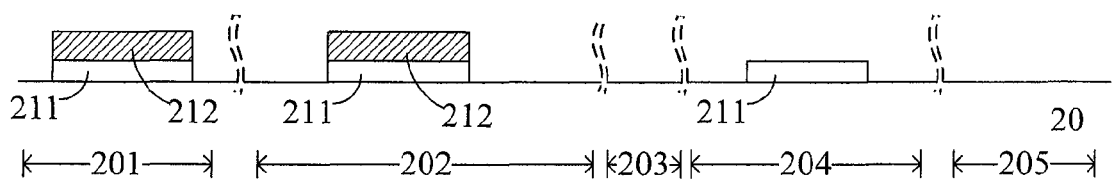

The structure depicted in FIG. 4a may also be obtained by a dual mask process instead of a single mask process, as shown in FIG. 5a and FIG. 5b. FIG. 5a illustrates formation of a structure of the patterned first transparent conductive layer 211. Initially, a first transparent conductive layer is formed throughout the substrate, after which a first mask is employed to form a first photo-resistor that defines etching regions. In FIG. 5a, the first photo-resistor is formed in the scan-pad region 201, the transistor region 202 and the storage capacitor region 204. Subsequently, regions of the patterned first transparent conductive layer 211 not covered by the first photo-resistor are etched to form the patterned first transparent conductive layer 211 in the scan-pad region 211, the transistor region 202 and the storage capacitor region 204, as shown in FIG. 5a. Then a first conductive layer is formed throughout the substrate. Similarly, a second mask is employed to form a second photo-resistor that defines etching regions. In FIG. 5b, the second photo-resistor is formed in regions having the patterned first transparent conductive layer 211. Subsequently, regions of the patterned first conductive layer 212 not covered by the second photo-resistor are etched to form the structure depicted in FIG. 5b, which is identical to that shown in FIG. 4a.

Figure 6A:
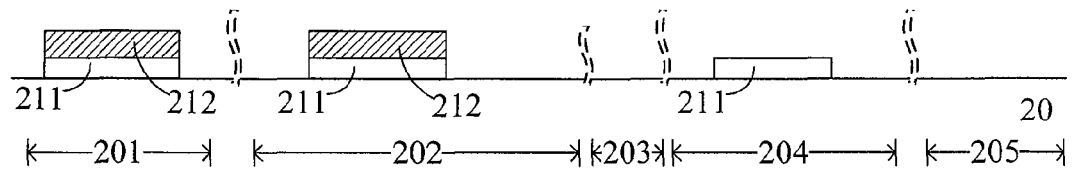
FIG. 6*a*-6*c* illustrates a schematic flow diagram of a process of forming a semiconductor structure with two masks.
Figure 6B:
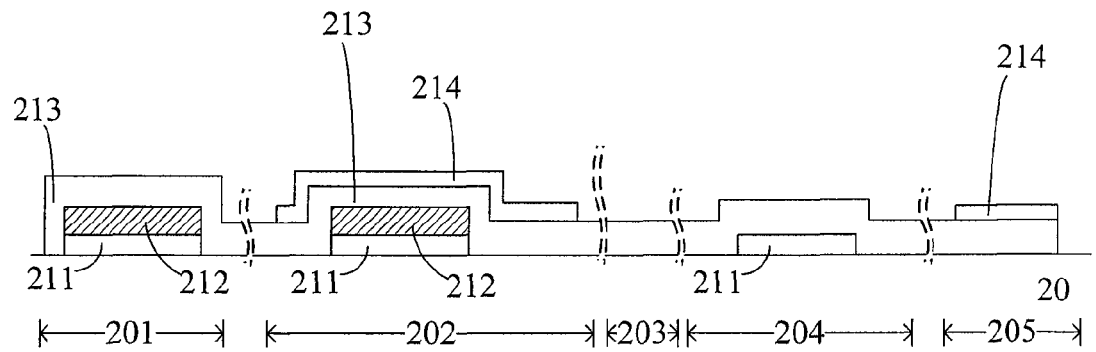
Figure 6C:
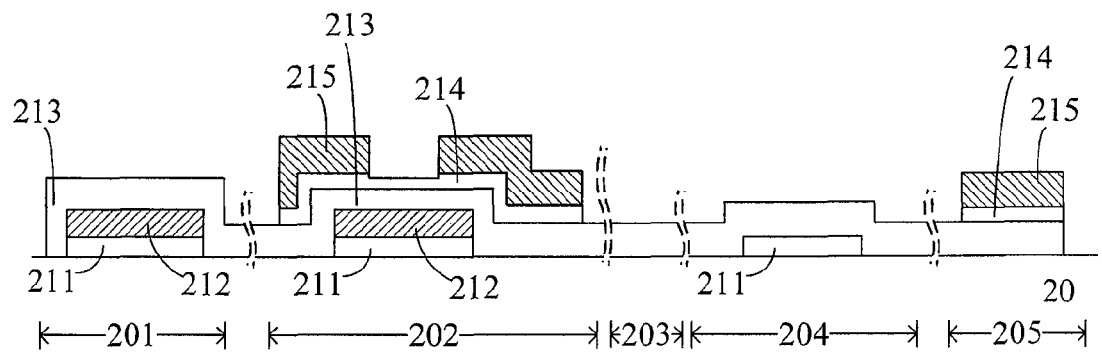

The structure depicted in FIG. 4b may also be formed by a dual mask process, as shown in FIGS. 6a-6c. FIG. 6a illustrates formation of the structure shown in FIG. 4a. Initially, a dielectric layer and a semiconductor layer are formed throughout the substrate, after which a third mask is employed to form a third photo-resistor that defines etching regions. In FIG. 6b, the third photo-resistor is formed in the transistor region 202 and the data-pad region 205. Subsequently, regions of the patterned semiconductor layer 214 not covered by the third photo-resistor are etched to form the patterned semiconductor layer 214 in the transistor region 202 and the data-pad region 205, as shown in FIG. 6b. Additionally, etching of the semiconductor layer may also be accomplished by scanning the substrate 20 with an AP plasma. Then a second conductive layer 215 is formed throughout the substrate. Similarly, a fourth mask is employed to form a fourth photo-resistor that defines etching regions. In FIG. 6c, the fourth photo-resistor is formed in the transistor region 202 and the data-pad region 205. Subsequently, regions of the second conductive layer not covered by the fourth photo-resistor are etched to form the structure depicted in FIG. 6c, which is identical to that shown in FIG. 4b. Additionally, etching of the patterned semiconductor layer 214 in the channel region may also be accomplished by scanning the substrate 20 with an AP plasma.

Both the patterned first transparent conductive layer 211 and the patterned second transparent conductive layer 216 in all the above embodiments may be made of one of the following materials: indium tin oxide (ITO), indium zinc oxide (IZO), indium tin zinc oxide (ITZO), Al-doped zinc oxide (ZAO), gallium-doped zinc oxide (GZO), and a combination thereof.

It follows from the above embodiments that, the LCD device and the manufacturing method thereof disclosed in this invention are at least applicable to manufacturing processes involving one to three half-tone masks, and those involving three to six half-tone masks. This invention can provide a storage capacitor employing two patterned transparent conductive layers as two electrodes thereof, which may be integrated into the existing manufacturing process, thereby to simplify the manufacturing process steps and reduce the number of masks required. Moreover, in this way, the storage capacitor is rendered light transmissive, thus enlarging the transparent area of the display device and improving the aperture ratio thereof.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of manufacturing a liquid crystal display (LCD) device, the LCD device comprising a substrate at least having a transistor region, a pixel region, and a storage capacitor region, the manufacturing method comprising the steps of:

(a) forming a conductive structure including a gate in the transistor region and a first electrode in the storage capacitor region, wherein the gate is composed of a patterned first transparent conductive layer and a patterned first conductive layer stacked in series in the transistor region, and the first electrode is composed of the patterned first transparent conductive layer in the storage capacitor region;

(b) forming a semiconductor structure in the transistor region, the pixel region, and the storage capacitor region, wherein the semiconductor structure is composed of a dielectric layer, a patterned semiconductor layer, and a patterned second conductive layer stacked in series in the transistor region, and the dielectric layer in the pixel region and the storage capacitor region; and (c) forming a patterned second transparent conductive layer in the transistor region, in the pixel region, and in the storage capacitor region and removing a portion of the patterned second conductive layer, wherein the patterned second transparent conductive layer in the pixel region and in the storage capacitor region respectively construe a pixel electrode and a second electrode of the storage capacitor, and the patterned second transparent conductive layer in the transistor region used to defines a source region and a drain region of the transistor region;

wherein a first half-tone mask (HTM) is applied in the step (a) to form the conductive structure in a first single mask process, the first single mask process comprises the steps of:

forming a first transparent conductive layer on the substrate;

forming a first conductive layer to cover the first transparent conductive layer;

forming photo-resistors with different vertical dimensions in the transistor region and the storage capacitor region respectively by the first HTM to define etching regions;

etching the first conductive layer and the first transparent conductive layer at parts thereof that are not covered by the photo-resistors;

ashing the photo-resistors until exposing the patterned first conductive layer in the storage capacitor region;

etching the patterned first conductive layer in the storage capacitor region; and removing residual photo-resistors.

2. The method as claimed in claim 1, wherein a second half-tone mask (HTM) is applied in the step (b) to form the semiconductor structure in a second single mask process, the second single mask process comprises the steps of:

forming a dielectric layer, a semiconductor layer, and a second conductive layer on the substrate sequentially;

forming photo-resistors with different vertical dimensions in the transistor region, the pixel region, and the first electrode respectively by the second HTM to define etching regions;

etching the dielectric layer, the semiconductor layer ,and the second conductive layer at parts thereof that are not covered by the photo-resistors;

ashing the photo-resistors until exposing the patterned second conductive layer in the pixel region and the patterned second conductive layer on the first electrode in the storage capacitor region;

etching the patterned second conductive layer and the patterned semiconductor layer in the pixel region, and the patterned second conductive layer and the patterned semiconductor layer on the first electrode in the storage capacitor region; and removing residual photo-resistors.

3. The method as claimed in claim 1, wherein the patterned second transparent conductive layer is formed in a third single mask process in the step (c), the third single mask process comprises the steps of:

forming a second transparent conductive layer on the substrate;

forming a photo-resistor in the transistor region to define a channel region;

etching the second transparent conductive layer and the patterned second conductive layer in a channel region of the transistor region to expose the patterned semiconductor layer in the channel region; and removing the patterned semiconductor layer at part in the channel region.

4. The method as claimed in claim 1, wherein the substrate further comprises a scan-pad region and a data-pad region, the method comprises the steps of:

forming the patterned first transparent conductive layer and the patterned first conductive layer stacked in series in the scan-pad region in the step (a);

forming the dielectric layer, the patterned semiconductor layer, and the patterned second conductive layer stacked in series in the data-pad region in the step (b); and forming the patterned second transparent conductive layer to cover the scan-pad region and the data-pad region in the step (c).

5. The method as claimed in claim 4, wherein the step (b) with an AP plasma process comprises the steps of:

(b-1) forming the dielectric layer, the patterned semiconductor layer, and the patterned second conductive layer sequentially in a LCD device region;

(b-2) etching the patterned semiconductor layer by the AP plasma process using the patterned second conductive layer as a hard mask;

(b-3) positing a shielding mask;

(b-4) etching the dielectric layer at parts thereof that are not covered by the shielding mask by the AP plasma process; and (b-5) removing the shielding mask.

6. The method as claimed in claim 4, wherein the step (c) with an AP plasma process comprises the steps of:

(c-1) forming the patterned second transparent conductive layer;

(c-2) forming a photo-resistor in the transistor region to define the channel region;

(c-3) etching the patterned second transparent conductive layer and the patterned second conductive layer in the channel region to expose the patterned semiconductor layer in the channel region; and (c-4) etching the patterned semiconductor layer by the AP plasma process that uses the patterned second transparent conductive layer as a hard mask.

7. The method as claimed in claim 6, wherein the step (c-4) comprises the step of scanning the substrate by the AP plasma to etch the patterned semiconductor layer.

8. The method as claimed in claim 6, wherein the step (c) further comprises the steps of:

(c-5) forming a passivation layer;

(c-6) forming a shielding mask;

(c-7) etching the passivation layer at parts thereof that are not covered by the shielding mask with the AP plasma process; and (c-8) removing the shielding mask.

9. The method as claimed in claim 8, wherein the step (c-7) comprises the steps of spinning the substrate and applying the AP plasma to etch the dielectric layer at parts thereof that are not covered by the shielding mask.

10. The method as claimed in claim 1, wherein the substrate further comprises a scan-pad region and a data-pad region, the method comprises the steps of:
   forming the patterned first transparent conductive layer and the patterned first conductive layer stacked in series in the scan-pad region in the step (a);
   forming the dielectric layer, the patterned semiconductor layer, and the patterned second conductive layer in the data-pad region, as well as forming the dielectric layer to cover region of the scan-pad region; and
   wherein the step (c) further comprises the steps of:
   forming a passivation layer to cover the transistor region at part, the pixel region, the storage capacitor region, the scan-pad region at part, and the data-pad region at part before forming the patterned second transparent conductive layer; and
   forming the patterned second transparent conductive layer to cover the scan-pad region and the data-pad region.

11. The method as claimed in claim 10, wherein the step with an AP plasma process comprises the steps of:
   (b-1) forming the dielectric layer, the patterned semiconductor layer, and the patterned second conductive layer sequentially;
   (b-2) etching the patterned semiconductor layer by the AP plasma process using the patterned second conductive layer as a hard mask;
   (b-3) positing a shielding mask;
   (b-4) etching the dielectric layer at parts thereof that are not covered by the shielding mask by the AP plasma process; and
   (b-5) removing the shielding mask.

12. The method as claimed in claim 11, wherein the step (b-2) comprises the step of scanning the substrate by the AP plasma to etch the patterned semiconductor layer.

13. The method as claimed in claim 11, wherein the step (b-2) comprises the steps of spinning the substrate and applying the AP plasma to etch the dielectric layer at parts thereof that are not covered by the shielding mask.

14. The method as claimed in claim 1, further comprising the steps of:
   forming a passivation layer to cover the transistor region, the pixel region, and the storage capacitor region before forming the patterned second transparent conductive layer.

15. The method as claimed in claim 1, wherein the step (b) comprises the steps of:
   forming a dielectric layer and a semiconductor layer;
   forming a third photo-resistor by a third mask to define third etching regions;
   etching the dielectric layer and the semiconductor layer at parts thereof that are not covered by the third photo-resistor;
   forming a second conductive layer;
   forming a fourth photo-resistor by a fourth mask to define fourth etching regions; and
   etching the second conductive layer at parts thereof that are not covered by the fourth photo-resistor.

16. The method as claimed in claim 1, wherein the patterned first transparent conductive layer and the patterned second transparent conductive layer is made of a material selected from the groups consisting of indium tin oxide (ITO), indium zinc oxide (IZO), indium tin zinc oxide (ITZO), Al-doped zinc oxide (ZAO), and gallium-doped zinc oxide (GZO).

17. A method of manufacturing a liquid crystal display (LCD) device, the LCD device comprising a substrate at least having a transistor region, a pixel region, and a storage capacitor region, the manufacturing method comprising the steps of:
   (a) forming a conductive structure including a gate in the transistor region and a first electrode in the storage capacitor region, wherein the gate is composed of a patterned first transparent conductive layer and a patterned first conductive layer stacked in series in the transistor region, and the first electrode is composed of the patterned first transparent conductive layer in the storage capacitor region;
   (b) forming a semiconductor structure in the transistor region, the pixel region, and the storage capacitor region, wherein the semiconductor structure is composed of a dielectric layer, a patterned semiconductor layer, and a patterned second conductive layer stacked in series in the transistor region, and the dielectric layer in the pixel region and the storage capacitor region; and
   (c) forming a patterned second transparent conductive layer in the transistor region, in the pixel region, and in the storage capacitor region and removing a portion of the patterned second conductive layer, wherein the patterned second transparent conductive layer in the pixel region and in the storage capacitor region respectively construe a pixel electrode and a second electrode of the storage capacitor, and the patterned second transparent conductive layer in the transistor region used to defines a source region and a drain region of the transistor region;
   wherein a half-tone mask (HTM) is applied in the step (b) to form the semiconductor structure in a single mask process, the single mask process comprises the steps of:
      forming a dielectric layer, a semiconductor layer, and a second conductive layer on the substrate sequentially;
      forming photo-resistors with different vertical dimensions in the transistor region, the pixel region, and the first electrode respectively by the HTM to define etching regions;
      etching the dielectric layer, the semiconductor layer ,and the second conductive layer at parts thereof that are not covered by the photo-resistors;
      ashing the photo-resistors until exposing the patterned second conductive layer in the pixel region and the patterned second conductive layer on the first electrode in the storage capacitor region;
      etching the patterned second conductive layer and the patterned semiconductor layer in the pixel region, and the patterned second conductive layer and the patterned semiconductor layer on the first electrode in the storage capacitor region; and
      removing residual photo-resistors.

18. A method of manufacturing a liquid crystal display (LCD) device, the LCD device comprising a substrate at least having a transistor region, a pixel region, and a storage capacitor region, the manufacturing method comprising the steps of:
   (a) forming a conductive structure including a gate in the transistor region and a first electrode in the storage capacitor region, wherein the gate is composed of a patterned first transparent conductive layer and a patterned first conductive layer stacked in series in the transistor region, and the first electrode is composed of the patterned first transparent conductive layer in the storage capacitor region;

(b) forming a semiconductor structure in the transistor region, the pixel region, and the storage capacitor region, wherein the semiconductor structure is composed of a dielectric layer, a patterned semiconductor layer, and a patterned second conductive layer stacked in series in the transistor region, and the dielectric layer in the pixel region and the storage capacitor region; and (c) forming a patterned second transparent conductive layer in the transistor region, in the pixel region, and in the storage capacitor region and removing a portion of the patterned second conductive layer, wherein the patterned second transparent conductive layer in the pixel region and in the storage capacitor region respectively construe a pixel electrode and a second electrode of the storage capacitor, and the patterned second transparent conductive layer in the transistor region used to defines a source region and a drain region of the transistor region;

wherein the patterned second transparent conductive layer is formed in a single mask process in the step (c), the single mask process comprises the steps of:

forming a second transparent conductive layer on the substrate;

forming a photo-resistor in the transistor region to define a channel region;

etching the second transparent conductive layer and the patterned second conductive layer in a channel region of the transistor region to expose the patterned semiconductor layer in the channel region; and removing the patterned semiconductor layer at part in the channel region.

* * * * *